United States Patent [19]
Nishimura et al.

[11] Patent Number: 5,770,467
[45] Date of Patent: Jun. 23, 1998

[54] METHOD FOR FORMING ELECTRODE ON DIAMOND FOR ELECTRONIC DEVICES

[75] Inventors: Kozo Nishimura; Koji Kobashi; Shigeaki Miyauchi; Rie Kato; Hisashi Koyama; Kimitsugu Saito, all of Kobe, Japan

[73] Assignee: Kabushiki Kaisha Kobe Seiko Sho, Kobe, Japan

[21] Appl. No.: 622,858

[22] Filed: Mar. 29, 1996

Related U.S. Application Data

[63] Continuation of Ser. No. 219,422, Mar. 29, 1994, abandoned, which is a continuation of Ser. No. 958,754, Oct. 9, 1992, abandoned.

[30] Foreign Application Priority Data

Oct. 11, 1991 [JP] Japan ................................. 3-264159

[51] Int. Cl.$^6$ ................................. H01L 21/441
[52] U.S. Cl. .................... 437/187; 437/176; 437/977; 148/DIG. 100; 430/311
[58] Field of Search ................................. 437/187, 175, 437/81, 176, 977; 148/DIG. 139, DIG. 140, DIG. 100; 257/77; 430/311

[56] References Cited

U.S. PATENT DOCUMENTS

| | | | |
|---|---|---|---|
| 4,219,199 | 8/1990 | Okuda . | |
| 4,339,281 | 7/1982 | Chio | 134/1 |
| 4,509,991 | 4/1985 | Taur | 148/1.5 |
| 4,859,908 | 8/1989 | Yoshida et al. | 313/230 |
| 4,929,986 | 5/1990 | Yoder | 257/77 |
| 4,957,591 | 9/1990 | Sato et al. | 156/643 |
| 5,006,914 | 4/1991 | Beetz, Jr. | 257/77 |
| 5,055,424 | 10/1991 | Zeidler et al. . | |
| 5,068,020 | 11/1991 | Chu et al. . | |
| 5,139,970 | 8/1992 | Yamazaki | 437/184 |
| 5,155,559 | 10/1992 | Humphreys et al. | 437/175 |
| 5,173,761 | 12/1992 | Dreifus et al. | 257/77 |
| 5,212,401 | 5/1993 | Humphreys et al. | 437/176 |

FOREIGN PATENT DOCUMENTS

| | | |
|---|---|---|
| 0 086 022 | 8/1983 | European Pat. Off. . |
| 0 209 257 | 1/1987 | European Pat. Off. . |
| 0 408 265 | 1/1991 | European Pat. Off. . |
| 0419087 | 3/1991 | European Pat. Off. . |
| 0 458 530 | 11/1991 | European Pat. Off. . |
| 1 544 190 | 2/1972 | Germany . |
| 57-95897 | 6/1982 | Japan . |
| 58-143527 | 8/1983 | Japan . |
| 2 252 670 | 8/1992 | United Kingdom . |

OTHER PUBLICATIONS

Wolf et al, "Silicon Processing for The VLSI Era", vol. 1, pp. 335–361, 1986.

Wentorf et al: "Semiconducting Diamonds by Ion Bombardment," Physical Review, vol. 137, No. 5A, pp. A1614–A1616, Mar. 1, 1965.

Thin Solid Films, 185 (1990), pp. 71–78, Kobayashi et al., "Sputtering Characteristics of Diamond and Hydrogenated Amorphous Carbon Films by R. F. Plasma".

Official Letter (P4234101.9 w/Translation) of German Patent Application P 42 34 101.9–33; Nov. 15, 1995.

Thin Solid Films, vol. 212, pp. 19–24, 1992, K. Das, et al., "A Review of the Electrical Characteristics of Metal Contacts on Diamond".

*Primary Examiner*—Michael Trinh
*Attorney, Agent, or Firm*—Oblon, Spivak, McClelland, Maier & Neustadt, P.C.

[57] ABSTRACT

Disclosed is a method of forming electrodes on diamond comprising the steps of: forming a mask pattern on diamond or diamond film; performing a treatment of the diamond surface by a plasma of inert gases; forming an electrode film on the whole surface of the specimen; and removing the mask, thereby forming a specified pattern of the electrodes. By this method, it is possible to form electrodes having high adhesion to diamond and diamond film for electronic devices.

1 Claim, 2 Drawing Sheets

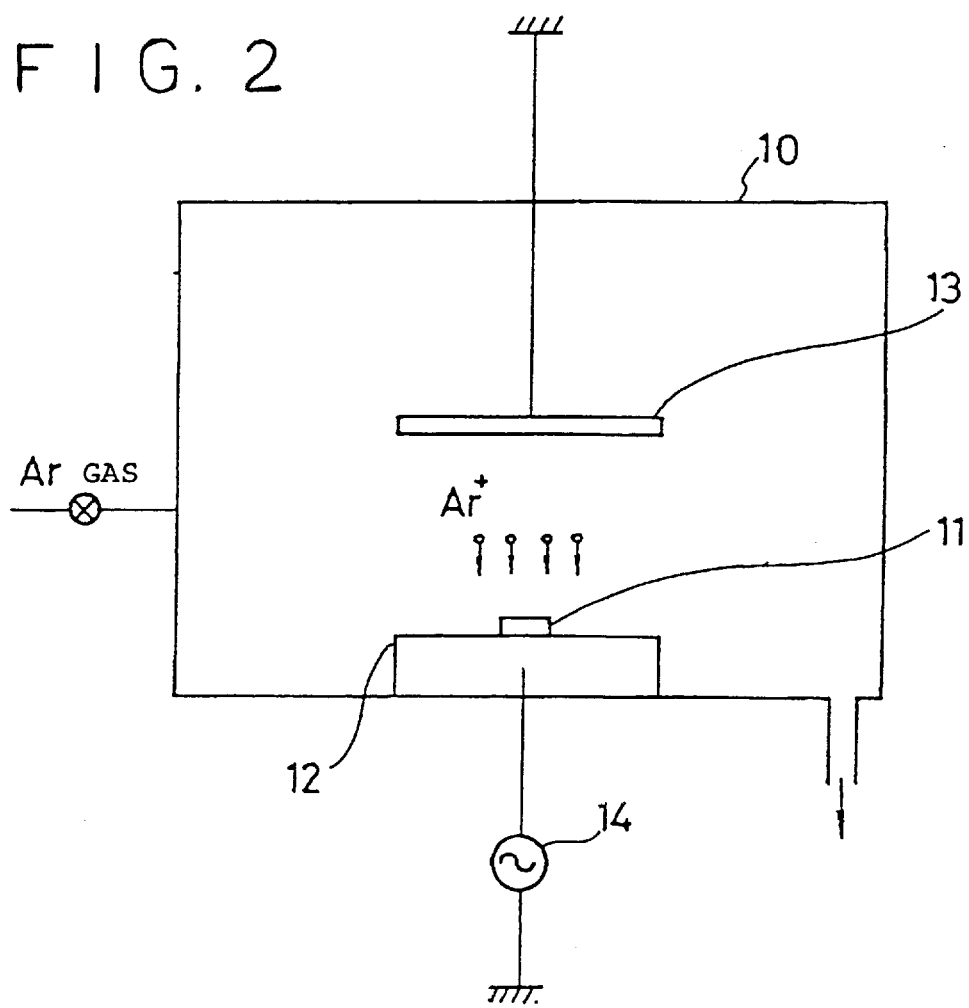

METHOD FOR FORMING ELECTRODE ON DIAMOND FOR ELECTRONIC DEVICES

This application is a continuation of application Ser. No. 08/219,422, filed on Mar. 29, 1994, (abandoned), which is a continuation of application Ser. No. 07/958,754, filed Oct. 9, 1992 (Abandoned).

BACKGROUND OF THE INVENTION

1. Field of the Invention

The present invention relates to a method for forming electrodes with high adhesion to diamond for diamond electronic devices such as heat sinks, diodes, and transistors.

2. Description of the Related Art

Diamond has high hardness and stability against heat, radiation, and chemicals. It also has a large band gap of 5.4 eV. Diamond is electrically insulating, but becomes semi-conducting by doping. Thus, diamond is expected to be used for electronic devices which can be operated at high temperatures. Furthermore, diamond is transparent over a wide wavelength range between ultraviolet and infrared, and is used for optical windows.

Diamond films formed by vapor deposition methods also have the above-mentioned excellent characteristics, and are used for coatings on cutting tools and speaker diaphragms, as well as for electronic applications such as heat sinks, diodes, and transistors.

It is well known that diamond film can be formed by vapor phase synthesis using plasma chemical vapor deposition (CVD) at low cost. Similarly for bulk diamonds, synthesized diamond film becomes semiconducting by doping with an impurity such as boron (B).

In the fabrication of electronic devices using diamond, it is necessary to form electrodes on the surface of diamond. Known methods of forming electrodes on the surface of diamond are as follows:

(I) Ohmic contacts were obtained by a method of vapor-deposition of metals liable to form carbides, e.g. Ta, on diamond followed by a heat treatment by electron beam irradiation, thus forming a carbide intermediate layer at the interface between diamond and the metal electrode, thereby enhancing the adhesion [A. T. Collons et al. Formation of electrical contacts on insulating and semi-conducting diamonds, Diamond Research, 1970]. This method will be referred to hereafter as Method I.

(II) Ohmic contacts were obtained by a method of vapor-deposition of metals liable to form a carbide, e.g. Mo, on diamond followed by a heat treatment using a vacuum furnace [K. L. Moazed et al. Material Research Society Symposium Proceedings 162, P.347, 1990).

Using this method, electrodes with high adhesion were formed by heat-treating metal films having multiple layer structures such as Au/Pt/Ti, Au/Ti, or the like. This method will be referred to hereafter as Method II.

(III) Metal electrodes were formed after irradiating Ar ions on the surface of diamond, thereby transforming the surface thereof into graphite [C. B. Child, Fourth Annual SD 10/IST-ONR Diamond Technology Initiative Symposium, 19891]. By this method, Au electrodes with high adhesion were formed on the surface of diamond. This method will be referred to hereafter as Method III.

However, the above-described methods have the following problems:

In Method I, it is necessary to perform the heat treatment using an electron beam generator at high vacuum, which is expensive and time consuming. Thus, this method is disadvantageous in terms of production cost.

In Method II, the metal electrodes which have been vapor-deposited on diamond must be heated at high temperature (e.g. 800° C.) to form a carbide. This causes stress at the interface between the electrode and the diamond due to the difference in thermal expansion coefficients. Thus, this method has the disadvantage that the electrodes are thermally damaged and tend to peel off from the diamond.

Also, in a heat treatment at high temperatures, the surface of a diamond is transformed into graphite. Thus, in this method, low resistance parasitic channels are liable to be formed on the surface of a diamond. Furthermore, similarly for Method I, since this method employs a vacuum furnace in the heat treatment, this process is very time consuming.

In Method III, an expensive ion beam generator has to be operated at high vacuum, which is costly and time consuming. Furthermore, when a processed sample is subjected to ultrasonic cleaning, the electrodes partially or totally peel off because of poor adhesion.

SUMMARY OF THE INVENTION

An objective of the present invention is to provide a method for forming electrodes with high adhesion to diamond for electronic device fabrication.

To achieve the objective, in a preferred mode of the present invention, there is provided a method for forming electrodes on electronic devices using diamond comprising the steps of: first performing a plasma treatment on the surface areas of a diamond where electrodes are to be formed by a plasma of inert gases, and then depositing electrode materials on the surface areas of the diamond.

BRIEF DESCRIPTION OF THE DRAWINGS

The above and other objectives, features, and advantages of the present invention will become more apparent from the following description taken in connection with the accompanying drawings, in which:

FIG. 2 is a typical view showing a magnetron sputtering apparatus.

DETAILED DESCRIPTION OF THE PREFERRED EMBODIMENTS

Figure 1A:
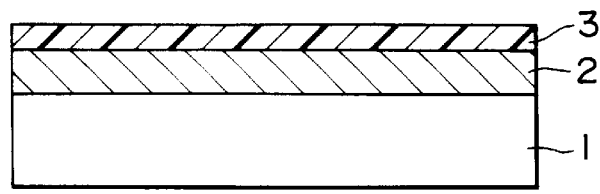
FIG. 1a to 1d are cross-sectional views showing a method for forming electrodes on a diamond film formed on a substrate, according to the first example of the present invention (Note that when bulk diamonds are used, substrate 1 in FIGS. 1a–1d is unnecessary.)

Prior to the description of the preferred embodiments, the function of the present invention will be explained.

The present applicants have found that a high adhesion of electrodes to diamond can be obtained by performing a plasma treatment of a diamond surface where the electrodes are to be formed, by a plasma of inert gases. By this treatment, hydrocarbon, water, and the like adhering on a diamond surface are removed by exposing the surface to the plasma, with the adhesion of the electrodes to the diamond surface becoming very high.

This invention can be employed not only for bulk diamond crystals, but also for diamond films synthesized by CVD.

Also, by this treatment, a very thin surface layer of a diamond surface area is transformed into graphite by the damage due to plasma exposure. This contributes to the improvement of the adhesion of the electrodes to the diamond surface, because the adhesion of metal films to graphite is generally better than that of metal films to diamond.

The above-mentioned inert gases include rare gases such as He, Ne, Ar, Kr, or Xe, or chemically inert gases such as $N_2$. During the plasma processing, a bias voltage, either direct or alternating current (DC or AC), may be applied on the sample holder to enhance the cleaning effect.

When a metal liable to form a carbide is used for an electrode on a diamond surface, which is then followed by a heat treatment under suitable conditions, a carbide layer is formed by the reaction between the metal electrodes and diamond, thus enhancing the adhesion of the electrode to diamond. This also creates electronic defect levels at the interface, which contribute to the ohmic nature of the contact.

Furthermore, diffusion of electrode materials occurs by a heat treatment, which also results in defect levels at the interface between the electrodes and diamond. Consequently, the ohmic electrodes are liable to be formed.

The temperature and duration of the heat treatment are dependent on the kinds of electrode material: for the case of Au/Ti, a heat treatment can be done at 400° C. for one hour.

Finally, and technologically more importantly, the process invented here, namely, the plasma treatment of a diamond surface followed by electrode formation, can be done in the same vacuum chamber for sputtering, for instance, as explained later in Examples 1–3. Therefore, there is no loss of time in the device fabrication process nor need for extra costly apparatus. Moreover, the present invention can be employed not only for bare diamond surfaces, but also for diamond surfaces photolithographically patterned by such mask materials as photoresist, metals, or ceramic films without damaging the mask materials during the plasma treatment under proper conditions.

The present invention will be more apparent by way of the following examples with reference to the accompanying drawings.

EXAMPLE 1

FIG. 1a to 1d are cross-sectional views showing a method of forming electrodes according to this example of the present invention in the order of fabrication processes when the electrodes are formed on a diamond film 2. However, note that no substrate is necessary when electrodes are formed on bulk diamond crystals.

FIG. 2 is a view of a standard magnetron sputtering apparatus used for the plasma treatment of the diamond surface. In FIG. 2, a sample 11 (consisting of a diamond film and a photoresist film) was mounted on a sample stage 12 in a vacuum chamber 10. The electrode 13 was grounded, and high frequency voltage was applied from an RF power supply 14 to the sample stage 12 to generate a plasma. The sample 11 was thus surface-treated by the plasma. In the above, the chamber 10 was evacuated to approximately $10^{-6}$ Torr, and then an inert gas (or a mixture of inert gases) was fed at the flow rate of 10 cc/min at a gas pressure of 2 mTorr into the chamber 10. The frequency of a power supply 14 was 13.56 MHz, the RF output was 100 W, and the plasma treatment time was 1 min.

In this example, the experiments were done in the following procedure:

(1) First, as shown in FIG. 1, a semiconducting diamond film 2 was formed on a substrate 1 to a thickness of approximately 2 $\mu$m by microwave plasma CVD. As a reaction gas for diamond film deposition, $CH_4$ was diluted by $H_2$ (concentration: 0.5%), and a doping gas of $B_2H_6$ (concentration: 0.01ppm) was added. During the CVD, the substrate temperature was maintained at 800° C., and the gas pressure in the reaction chamber was 35 Torr. The CVD was continued for 7 hours. The diamond film 2 thus obtained was then coated with a photoresist film 3 using the standard photolithography technique.

Figure 1B:
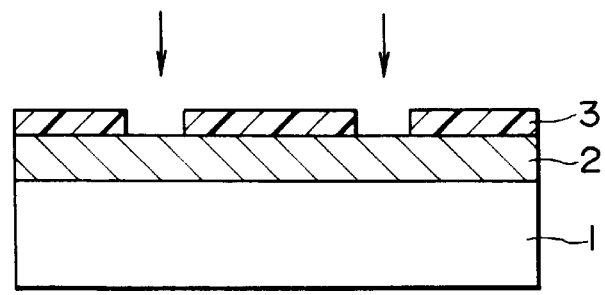

(2) As shown in FIG. 1b, openings according to the specified electrode pattern were formed on the photoresist film 3 using a photolithography technique. The specimen was then placed in the above-mentioned sputtering apparatus (FIG. 2), and plasma-treated using the conditions described above. As a result, only the surface area of the diamond film 2 were treated by a plasma through the openings.

Figure 1C:
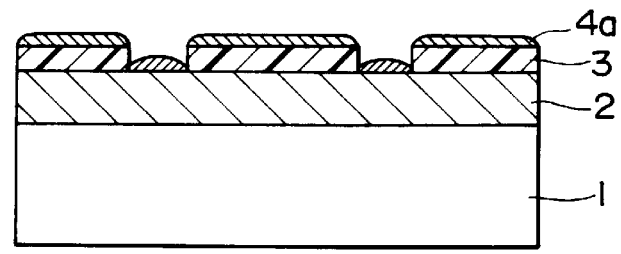

(3) The metal electrodes were formed using the same magnetron sputtering apparatus as shown in FIG. 1c. In this case, a target of electrode material was placed on the electrode 13, and a DC bias voltage was applied on the target side. The substrate side was grounded so that an electrode film 4a of a bilayer structure, made of a Ti film and an Au film, was formed on the whole surface of the substrate. The formation conditions of the Ti film and the Au film are shown in Table 1.

TABLE 1

|  | Ti film | Au film |
| --- | --- | --- |
| DC discharge condition | 0.8 A, 390 V | 0.2 A, 535 V |
| film deposition time | 15 sec. | 1 min. |
| film thickness | 400 Å | 2000 Å |

Figure 1D:
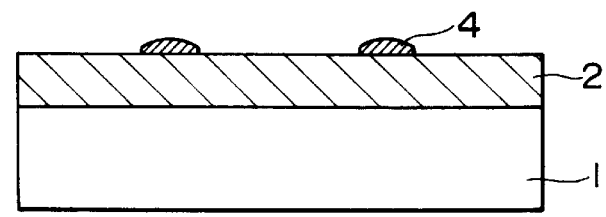

(4) As shown in FIG. 1d, the photoresist film 3 was removed together with the electrode film 4a on the photoresist film 3. Thus, a pattern of Au/Ti electrodes 4 was obtained.

The sample thus obtained was subjected to ultrasonic cleaning using pure water for 8 min., but the electrodes did not peel off. As a comparative example, a sample obtained by forming electrodes without the surface treatment by plasma was subjected to ultrasonic cleaning in the same conditions as in this example. However, more than 90% of the electrode pattern peeled off after approximately 10 sec.

EXAMPLE 2

A similar experiment as in Example 1 was carried out. Here, an $S_iO_2$ film was deposited on a diamond film by magnetron sputtering in place of the photoresist film of Example 1, and the openings were formed on the $SiO_2$ film according to a predetermined pattern by etching using a photolithography technique. Au/Ti electrodes were then deposited on the surface of the sample. The sample thus obtained was subjected to the ultrasonic cleaning in the same condition as in Example 1. However, no electrodes peeled off.

In the surface treatment using the inert gas plasma in Examples 1 and 2, the RF output applied to the electrode 11 was changed. When the RF output was 600 W, the electrode pattern formed by the photoresist film was severely damaged, which made it impossible to form the electrodes by the lift-off method. Therefore, when a high RF output was required, an $S_iO_2$ film was preferably used in place of the photoresist film as a mask material.

EXAMPLE 3

The experiment was repeated in a similar manner as in Examples 1 and 2. In this case, the heat treatment was done after the plasma treatment and the electrode formation, under the condition of a temperature of 400° C., a pressure of $10^{-6}$ Torr, and a processing time of 30 min. The sample was then subjected to an ultrasonic cleaning in the same conditions as described in Example 1. However, no separation of the electrodes was found. In this example, the contact resistance between each metal electrode and the diamond film was reduced by approximately 2 orders of magnitude as compared with the cases without heat treatment.

What is claimed is:

1. A method for forming an electronic device, comprising the steps of:

coating a surface of a diamond with a photoresist; followed by photolithographically forming openings in the photoresist according to a specified electrode pattern, thereby exposing a region or regions of said surface through said openings; followed by treating said region or regions of said surface with a plasma, without damaging said photoresist; followed by depositing a thin metal film on said photoresist and said region or regions of said surface; followed by removing the photoresist from said surface; followed by performing a heat treatment on said diamond with said thin metal film thereon;

wherein said plasma is generated by an alternating current, said plasma consists essentially of at least one gas selected from the group consisting of helium, neon, argon, krypton, xenon and nitrogen, said thin metal film comprises titanium or gold, and said plasma is generated by a RF output of less than 600 W.

* * * * *